US007859796B2

(12) United States Patent
Deguchi et al.

(10) Patent No.: US 7,859,796 B2
(45) Date of Patent: Dec. 28, 2010

(54) DISK DRIVE AND ARM COIL SUPPORT ASSEMBLY

(75) Inventors: Takaaki Deguchi, Kanagawa (JP); Kohichi Suzuki, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 931 days.

(21) Appl. No.: 11/150,400

(22) Filed: Jun. 10, 2005

(65) Prior Publication Data

US 2005/0280948 A1 Dec. 22, 2005

(30) Foreign Application Priority Data

Jun. 17, 2004 (JP) ............... 2004-179280

(51) Int. Cl.
*G11B 5/48* (2006.01)
(52) U.S. Cl. ................. 360/264.2; 360/245.9
(58) Field of Classification Search ........... 360/245.8, 360/245.9, 264.2, 266.3
See application file for complete search history.

(56) References Cited

U.S. PATENT DOCUMENTS

| 4,933,785 | A | | 6/1990 | Morehouse et al. | |
|---|---|---|---|---|---|
| 5,231,549 | A | | 7/1993 | Morehouse et al. | |
| 5,657,300 | A | * | 8/1997 | Takahashi | 369/13.17 |
| 5,668,684 | A | * | 9/1997 | Palmer et al. | 360/264.2 |
| 5,731,930 | A | * | 3/1998 | Maggio et al. | 360/264.2 |
| 5,818,667 | A | * | 10/1998 | Larson | 360/264.2 |
| 5,872,669 | A | | 2/1999 | Morehouse et al. | |
| 5,961,334 | A | | 10/1999 | Inaba | |
| 5,978,177 | A | * | 11/1999 | Takasugi | 360/245.9 |
| 5,991,123 | A | * | 11/1999 | Casey | 360/264.2 |
| 6,025,988 | A | * | 2/2000 | Yan | 361/685 |
| 6,154,344 | A | * | 11/2000 | Marek | 360/264.2 |
| 6,166,888 | A | * | 12/2000 | Tsuda et al. | 360/264.2 |
| 6,351,351 | B1 | | 2/2002 | Takasugi | |
| RE37,869 | E | * | 10/2002 | Suzuki | 360/97.01 |
| 6,529,350 | B1 | * | 3/2003 | Itoh | 360/264.2 |
| 6,690,546 | B2 | | 2/2004 | Gouo | |
| 6,704,165 | B2 | * | 3/2004 | Kube et al. | 360/245.9 |
| 6,771,470 | B1 | | 8/2004 | Yagi | |
| 2001/0030836 | A1 | * | 10/2001 | Katsumata | 360/244.1 |
| 2003/0189796 | A1 | * | 10/2003 | Hayakawa et al. | 360/264.2 |

(Continued)

FOREIGN PATENT DOCUMENTS

JP 09-312010 12/1997

*Primary Examiner*—Brian E Miller
(74) *Attorney, Agent, or Firm*—Mahamedi Paradice Kreisman LLP; Christopher J. Brokaw

(57) ABSTRACT

A disk drive and an arm coil support assembly are to be provided which enables a trace to be disposed with a simple construction without the need of machining arms. In one embodiment, a trace for connection between a head and an FPC is disposed on an opposite surface of each of arms and opposite to a confronting surface of each of the arms which confronts a recording surface of a disk. The trace is bent nearly vertically in the vicinity of a connection between a coil support which supports the arms, and holds a VCM coil and the arm and is connected to the FPC. The coil support includes a force mechanism having a gap for insertion therein of the trace and also having a pressure portion spaced through the gap from the surface on which the trace is disposed. The force mechanism prevents wafting of the trace from the opposite surface of the arm caused by the bending of the trace.

19 Claims, 6 Drawing Sheets

U.S. PATENT DOCUMENTS

| | | | |
|---|---|---|---|
| 2004/0240118 A1* | 12/2004 | Hayakawa et al. | 360/264.2 |
| 2004/0240119 A1* | 12/2004 | Nakamura et al. | 360/264.2 |
| 2005/0013051 A1* | 1/2005 | Katsumata | 360/244.1 |
| 2005/0018357 A1* | 1/2005 | Hashi et al. | 360/264.2 |
| 2005/0195530 A1* | 9/2005 | MacPherson | 360/264.2 |
| 2005/0254176 A1* | 11/2005 | McReynolds et al. | 360/264.2 |
| 2006/0039087 A1* | 2/2006 | Ho et al. | 360/264.2 |
| 2007/0153427 A1* | 7/2007 | Izumi et al. | 360/264.2 |

* cited by examiner

DISK DRIVE AND ARM COIL SUPPORT ASSEMBLY

CROSS-REFERENCES TO RELATED APPLICATIONS

This application claims priority from Japanese Patent Application No. JP2004-179280, filed Jun. 17, 2004, the entire disclosure of which is incorporated herein by reference.

BACKGROUND OF THE INVENTION

The present invention relates to a disk drive and an arm/coil support assembly. Particularly, the present invention is concerned with a disk drive suitable for a hard disk drive having a single disk for recording user data thereon, as well as an arm coil support assembly mounted thereon.

Devices using various types of media such as optical disks and magnetic tapes are known as information recording and reproducing devices. Among them, hard disk drives (HDDs) have become popular as storage devices for computers to such an extent that they are one of the storage devices indispensable for today's computers. Further, not limited to computers, their application is widening more and more due to the superior characteristics with the advent of moving picture recording/reproducing devices, car navigation systems, removable memories for digital cameras and so on.

The HDD includes a magnetic disk for recording data and a head for writing and reading data between it and the magnetic disk. The head includes a head element as a thin film element and a slider with the head element disposed on a surface thereof. The head element includes a write element which converts an electric signal into a magnetic field in accordance with data to be recorded onto the magnetic disk and a read element which converts a magnetic field provided from the magnetic disk into an electric signal. Typically, both write element and read element are integrally formed in one thin film element.

The HDD further includes an actuator for moving the head to a desired position over the magnetic disk. The actuator is driven by a voice coil motor (VCM) and moves pivotally about a pivot shaft, thereby moving the head radially over the magnetic disk which is rotating. As a result, the head (head element) makes access to a desired track formed on the magnetic disk, whereby read and write of data can be performed.

The HDD includes a head stack assembly (HSA) adapted to rotate up to a predetermined position over the disk while holding the head. The head stack assembly includes a VCM coil, a head gimbals assembly (HGA), a bearing unit and a flexible printed circuit (FPC) board, the head gimbals assembly comprising a gimbals which holds the head, a suspension and an arm.

The FPC board is a circuit board for the transfer of signals provided from the head and a driving current for the VCM coil. A pre-amplifier for amplifying signals handled in the head element is mounted on the FPC board.

The HDD includes a trace for transmitting signals from the head to FPC or from FPC to the head. The trace is a wiring portion extending from the head to terminals formed on the FPC board. One end of the trace is connected to the head and an opposite end thereof is connected to the FPC board. The trace is also called ILS (Integrated Leads Suspension) or FOS (Flex On Suspension).

For example, in Japanese Patent Laid-open No. Hei 9-321010 (Patent Document 1) is disclosed a magnetic disk drive wherein a trace connecting between a head and FPC is disposed using as guide a stepped or grooved portion of an arm. An actuator portion used in the magnetic disk drive described in the publication includes plural gimbals which support magnetic head sliders elastically, plural guide arms (arms) having rigidity and supporting the gimbals, an actuator (carriage (a coil support for supporting a VCM coil) and VCM) which holds the arms through a clamp member and on a side face of which are provided FPC terminals connected to the exterior, and plural printed wiring patterns (traces) formed on side faces of the arms and on planar portions of the gimbals parallel to a magnetic disk.

The arms are each provided on a side edge thereof with a stepped portion of a laterally convex shape, and traces are affixed to upper and lower surfaces of the stepped portion to effect wiring. This is because the spacing between magnetic disks tends to become narrower to meet the recent demand for the reduction in size and thickness of a magnetic disk drive and so it is difficult to lay cables on the arm surface and also because the use of the stepped portion as guide intends to facilitate wiring.

BRIEF SUMMARY OF THE INVENTION

According to the technique described in the above Patent Document 1, however, it is necessary to perform machining of each arm such as forming a stepped portion of a laterally convex shape in a side edge portion of each arm or forming grooves in side edge portions of upper and lower surfaces of the arm. Without machining of the arm, there is a fear of contact between the magnetic disk and cables and it is difficult to lay cables on the arm surface.

The present invention has been accomplished for solving the above-mentioned problems and it is a feature of the present invention to provide a disk drive and an arm/coil support assembly both enabling a trace to be disposed by a simple construction without the need of machining arms.

According to an aspect of the present invention, there is provided a disk drive comprising a head adapted to perform either write or read of information to or from one or plural disks, an arm for supporting the head, a flexible printed circuit board, a trace disposed on an opposite surface of the arm opposite to a confronting surface which confronts a recording surface of the disk(s), one end of the trace being connected to the head and an opposite end thereof is bent and connected to the flexible printed circuit board, or the flexible printed circuit board is bent and the opposite end of the trace being connected to the bent flexible printed circuit board, and a force mechanism for preventing wafting of the trace from the opposite surface caused by the bending.

In case of disposing the trace on the confronting surface, it has so been necessary to bond the trace to a groove or the like for preventing contact of the trace with the disk. In embodiments of the present invention, since the trace is disposed on the opposite surface of the arm on the side isolated from the recording surface of the disk, it is not necessary to bond the trace to the arm surface. If the trace is laid on the opposite surface, then at the time of connection thereof to the flexible printed circuit board (FPC), it is necessary to bend either the trace or the flexible printed circuit board and then perform the connection. However, wafting of the trace from the arm surface at the bent portion can be prevented by the force mechanism.

The force mechanism can have a pressure portion spaced through a gap from the surface on which the trace is disposed, and the trace can be inserted into the gap. By inserting the trace into the gap and then bending the trace, it is possible to prevent warping of the trace caused by the bending.

The opposite end of the trace can be bent nearly perpendicularly to the confronting surface side and be connected to the flexible printed circuit board, and the force mechanism can prevent wafting of the trace from the opposite surface caused by the bending.

The disk drive can further comprise a coil support for supporting a VCM coil and also supporting the arm, and the coil support can be formed by integral molding.

The disk drive can further comprise a coil support for supporting a VCM coil and also supporting the arm, the force mechanism can have a pressure portion spaced through a gap for insertion therein of the trace from the surface on which the trace is disposed, and the coil support and the pressure portion can be formed by integral molding with use of a molding resin. By integral molding with use of a molding resin, it is possible to reduce the manufacturing cost.

The coil support can be provided on a side face thereof with a metallic plate for fixing thereto of the flexible printed circuit board, and the trace and the flexible printed circuit board can be connected together on the metallic plate.

The opposite end of the trace can be connected to the flexible printed circuit board which is bent, and the force mechanism can prevent wafting of the trace and the flexible printed circuit board from the opposite surface caused by the bending.

The number of the disk(s) is one and recording surfaces can be formed on one or both sides of the disk, and in the case where recording surfaces are formed on both sides of the disk, the head and the arm can be provided for each of the recording surfaces.

The number of the disk(s) can be two or more and a recording surface can be formed on an outermost surface of the disks, and the force mechanism can prevent wafting of the trace disposed on the opposite surface of the arm which is provided for the recording surface of the outermost surface. In this case, in the arm(s) disposed for the top or bottom surface or both top and bottom, the surfaces, the trace disposed on the opposite surface of the arm where no disk is disposed can be prevented from wafting.

An arm coil support assembly according to an embodiment of the present invention comprises an arm for supporting a head adapted to perform either write or read of information to or from one or plural disks, and a coil support for supporting the arm, the coil support having a gap for insertion therein of a trace, the trace being disposed on an opposite surface of the arm opposite to a confronting surface which confronts a recording surface of the disk(s).

Since the coil support has a gap for insertion therein of a trace, when the trace is bent and connected to a flexible printed circuit board, it is possible to prevent warping of the bent portion of the trace. In the case where the flexible printed circuit board is bent and the trace is connected to the bent flexible printed circuit board, it is possible to prevent warping of the bent portion of the flexible printed circuit board.

The coil support can have a plate portion spaced through a gap from the trace-disposed surface, one end of the plate portion can be connected to the head and an opposite end thereof can be bent and connected to the flexible printed circuit board, or the flexible printed circuit board can be bent and the opposite end of the plate portion can be connected to the bent flexible printed circuit board. When the trace is disposed on the opposite surface of the arm, it is possible to prevent wafting of the trace from the opposite surface.

According to the present invention, a trace for connection between the head and the flexible printed circuit board can be disposed by a simple construction without the need of machining arms.

DETAILED DESCRIPTION OF THE INVENTION

Embodiments of the present invention will be described in detail hereinunder with reference to the drawings. In the following embodiments the present invention is applied to an arm coil support assembly using a coil support formed by integral molding of a molding resin to facilitate wiring of a trace for connection between a head and an FPC board and capable of being produced at a low cost, as well as a hard disk drive which carries the arm coil support assembly.

Figure 1:
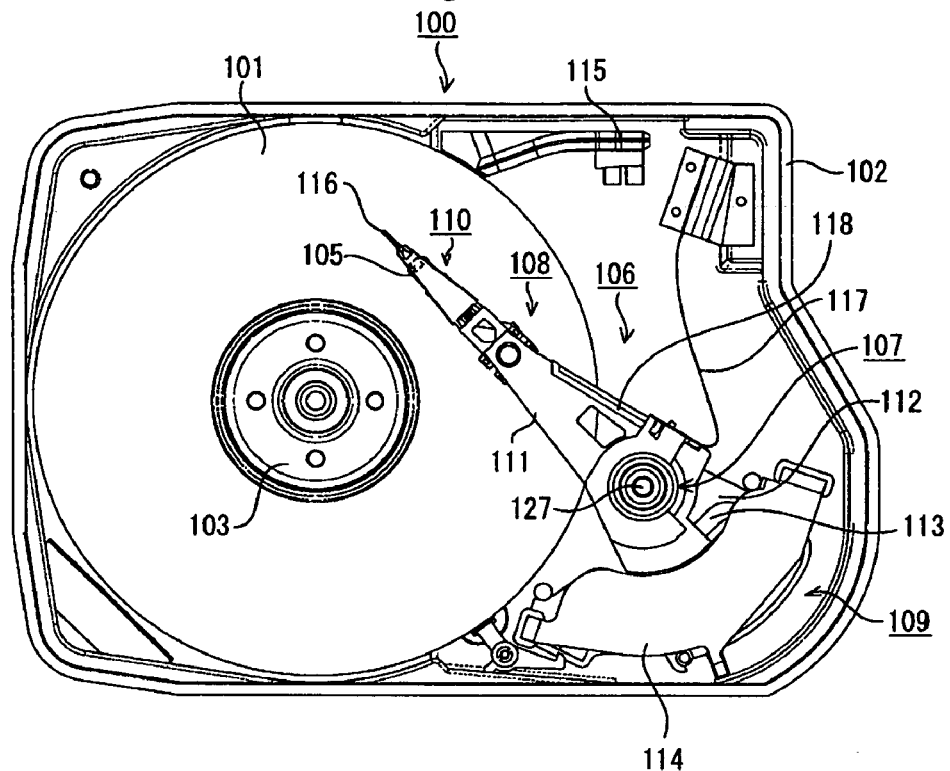
FIG. 1 shows a schematic construction of a hard disk drive according to an embodiment of the present invention.

FIG. 1 illustrates a schematic construction of a hard disk drive (HDD) 100 according to a first embodiment of the present invention. As shown in the same figure, the HDD 100 includes a magnetic disk 101 for recording data thereon, a base 102 to which a spindle motor (not shown) for rotating the magnetic disk 101 at a predetermined speed is fixed, and a clamp 103 for fixing the magnetic disk 101 to the spindle motor. The magnetic disk 101 is at rest when the HDD 100 is OFF.

The magnetic disk 101 is a medium (recording disk) for the storage of data. It is a non-volatile recording disk having a magnetic layer adapted to be magnetized to record data. The magnetic disk 101 is a single magnetic disk of a double-recording type. A cover (not shown) is fixed to the base 102 through a gasket (not shown) to close an upper opening of the base 102 and thereby constitute a disk enclosure. The disk enclosure can receive therein various components of the HDD 100 in a hermetically sealed state.

The HDD 100 includes a head 105 for making access to a storage area on the magnetic disk 101 to write or read data to or from the storage area. The head 105 includes a head element and a slider to which the head element is fixed. A write head portion which converts an electric signal into a magnetic field in accordance with data to be recorded to the magnetic disk 101 and a read head portion which converts a magnetic field provided from the magnetic disk 101 into an electric signal are integrally formed in the head element. The write head portion and the read head portion may be formed separately. Further, the present invention is applicable to an HDD having either the write head portion or the read head portion.

The HDD 100 includes an actuator 106 for rotating the magnetic disk 101 to a predetermined position while holding the head. The actuator 106 includes a voice coil motor (VCM)

109 as a drive mechanism. The VCM 109 includes a VCM coil 113 and a VCM magnet (not shown). The VCM coil 113 generates a driving force under the magnetic field generated by the VCM magnet.

The actuator 106, which is pivotably held by a pivot shaft 127, includes a suspension 110 which holds the head 105, an arm 111 which supports the suspension 110, a coil support 112 connected to the arm 111, a bearing unit 107, and a flexible printed circuit (FPC) board 117 for the transfer of signals provided from the head 105 and a driving electric current for the VCM coil 113.

A head gimbals suspension assembly (HGA) is constituted by a slider (not shown) which holds the head element, a gimbals (not shown) to be described later, the suspension 110 and the arm 111. Further, a head stack assembly (HSA) is constituted by the VCM coil 113, HGA, bearing unit 107 and FPC 117. The VCM 109 generates a driving force for HSA.

The construction of the suspension 110 will be described in detail later. The arm 111 is typically formed of an aluminum alloy or a stainless metal. The arm 111 is formed in a required shape by etching. For example, a rear opening for insertion therein of the pivot shaft 127 is formed therein. The suspension 110 is caulked onto a surface of the arm 111 opposed to a recording surface of the magnetic disk 101. From the standpoint of dynamic characteristics it is preferable that the mass of the suspension 110 be symmetric with respect to a line joining the axis of the pivot shaft and the slider on the head 105. Further, from the standpoint of diminishing vibrations in a twist mode, it is preferable that an external form of the arm 111 be symmetric with respect to the line joining the axis of the pivot shaft and the slider on the head 105.

The coil support 112 held pivotably by the pivot shaft 127 holds the flat coil (VCM coil) 113 on the side opposite to the arm 111 with respect to the pivot shaft 127. Numeral 114 denotes an upper stator magnet holding plate fixed to the base 102. Under the flat coil 113, though not shown, a lower stator magnet holding plate is disposed so as to sandwich the flat coil 113 in between it and the upper stator magnet holding plate 114. The VCM 109 includes the flat coil 113, a stator magnet (not shown) fixed to the upper stator magnet holding plate 114, and a stator magnet (not shown) fixed to the lower stator magnet holding plate.

A pre-amplifier for amplifying signals handled in the magnetic head element is mounted on FPC 117. The pre-amplifier may be mounted on a signal processing substrate, not on FPC 117. Between the FPC 117 and the head 105 is disposed a flexible printed wiring (trace) 118 for electrical connection between the two. As will be described later, one end of the trace 118 is connected to the head 105 and an opposite end thereof is connected to the FPC 117. Thus, on the head 105 side, the trace 118 extends on a surface (hereinafter referred to as the "confronting surface") which confronts the recording surface of the disk 101. Therefore, for preventing contact of the trace 118 with the recording surface, the trace 118 is bent so as to extend along a side face of the arm 111 from a certain position of the arm 111, preferably as close as possible to the head 105, and reach a surface ("opposite surface" hereinafter) opposite to the confronting surface, and is disposed along and near an edge on the opposite surface of the arm 111. On the FPC 117 side, the trace 118 is bent nearly perpendicularly from the opposite surface toward the confronting surface and is connected to the FPC 117.

The coil support 112 includes a force mechanism for preventing wafting of the trace 118 from the opposite surface due to warping caused by the aforesaid bending of the trace 118 or due to rotation of the disk 101. The force mechanism includes a pressure portion spaced through a predetermined gap from the surface on which the trace 118 is disposed. The trace 118 is loosely inserted into the gap. A board surface with terminals provided thereon of the FPC 117 is fixed to a side face of the coil support 112, and an end portion of the trace 118 which is bent and the terminals on the board surface are connected with each other. Thus, the force mechanism formed in the coil support 112 independently possesses the function of preventing wafting of the trace 118 from the arm surface. It prevents wafting of the trace caused by a repulsive force which results from bending of the bent portion. Accordingly, it is possible to suppress flutter caused by wafting of the trace 118.

The HDD 100 includes a ramp 115 for retraction of the head 105 from over the surface of the magnetic disk 101 when the rotation of the disk stops. A tab 116 is formed at an extreme end of the suspension 110. The ramp 115 is secured to the bottom or a side face of the base 102 through a support rod located at a position deviated from a movement path of the tab 116.

Thus, by disposing the ramp 115 so as not to overlap the magnetic disk 101, it is possible to prevent the occurrence of pneumatic friction which could occur between the magnetic disk 101 during rotation and the ramp 115 and hence possible to suppress the consumption of electric power caused by windage loss. Further, it is possible to prevent an air flow over the magnetic disk 101 from being disturbed by the ramp 115 and hence possible to prevent the flying stability of the head 105 from being obstructed.

In accordance with a drive signal flowing in the flat coil 113 from a controller (not shown) the VCM 109 enables the carriage 108 to pivot about the pivot shaft 127 to move the head 105 to a position over the recording surface of the magnetic disk 101 or enables to move the head 105 to the ramp 115 from over the recording surface of the magnetic disk 101.

For read or write of data from or to the magnetic disk 101, the actuator 106 moves the head 105 to a position over the data area on the surface of the magnetic disk 101 which is rotating. As the actuator 106 moves pivotally, the head 105 moves radially of the recording surface of the magnetic disk 101 and can thereby access a desired track. Pressure induced by the viscosity of air between an ABS (Air Bearing Surface) of the slider opposed to the magnetic disk 101 and the same disk becomes balanced with pressure applied toward the magnetic disk 101 by the suspension 110. As a result, the head 105 flies over the magnetic disk 101 through a certain gap.

When the rotation of the magnetic disk 101 stops, the head 105 comes into contact with the surface of the magnetic disk 101, giving rise to problems caused by an attractive phenomenon such as scratching of the data area and failure to rotate of the magnetic disk. To avoid such problems, when the rotation of the magnetic disk 101 stops, the actuator 106 unloads the head 105 from the magnetic disk surface onto the ramp 115.

Although the description of this embodiment refers to the HDD using a single magnetic disk 101 of a double-side recording type, the present invention is also applicable to an HDD having a magnetic disk of a one-side recording type. In this case, the bottom of the ram can be firmly fixed to the bottom of the base because the tab of the underside suspension need not be taken into account.

Next, the construction of the suspension 110 will be described in detail. In the suspension 110 used in this embodiment, the actuator 106 lying on the ramp 115 and stop position (unload position) is spaced away from an outer periphery edge of the magnetic disk 101 and so is provided with the tab 116 centrally of its extreme end. At the timing when the tab 116 gets on or leaves the ramp 115 it is necessary that the head 105 be flying over the magnetic disk 101 which is rotating. To meet this requirement, the tab 116 has a predetermined or larger length. The tab 116 and the suspension 110 are formed so as to retain their rigidity correspondingly to the long tab 116. However, the construction of the suspension 110 is not limited to the one just described.

Figure 2:
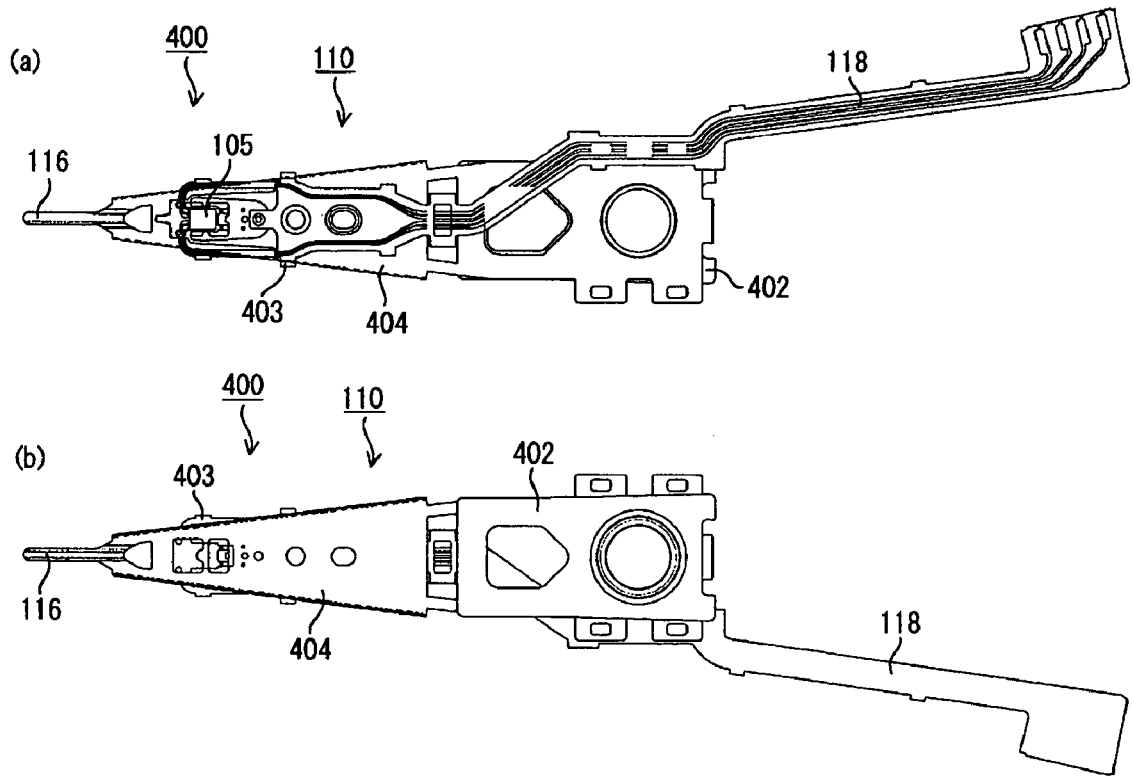
FIG. 2 shows the construction of a head suspension assembly used in the embodiment.
Figure 3:
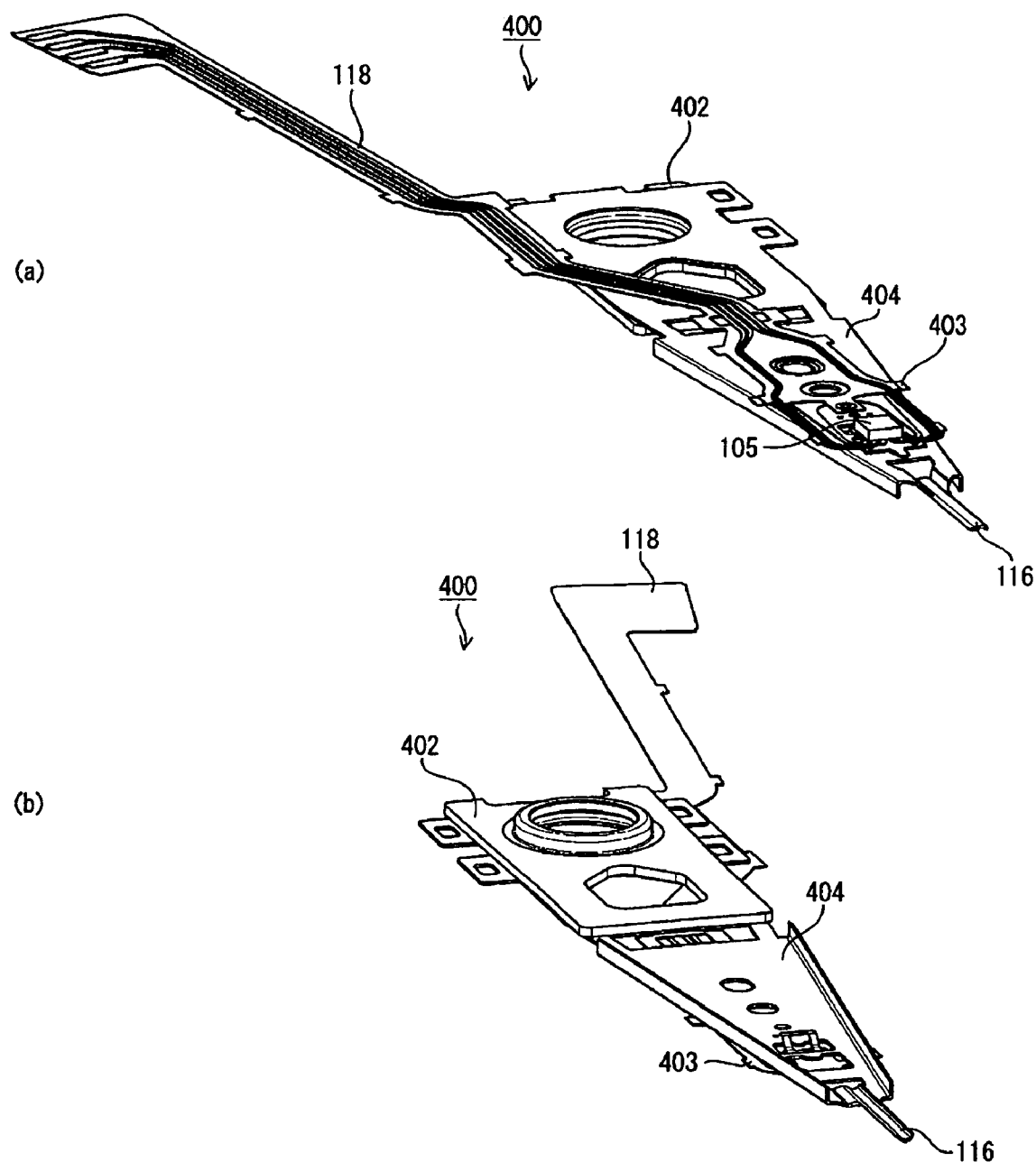
FIG. 3 is a perspective view showing the construction of the head suspension assembly.
Figure 4:
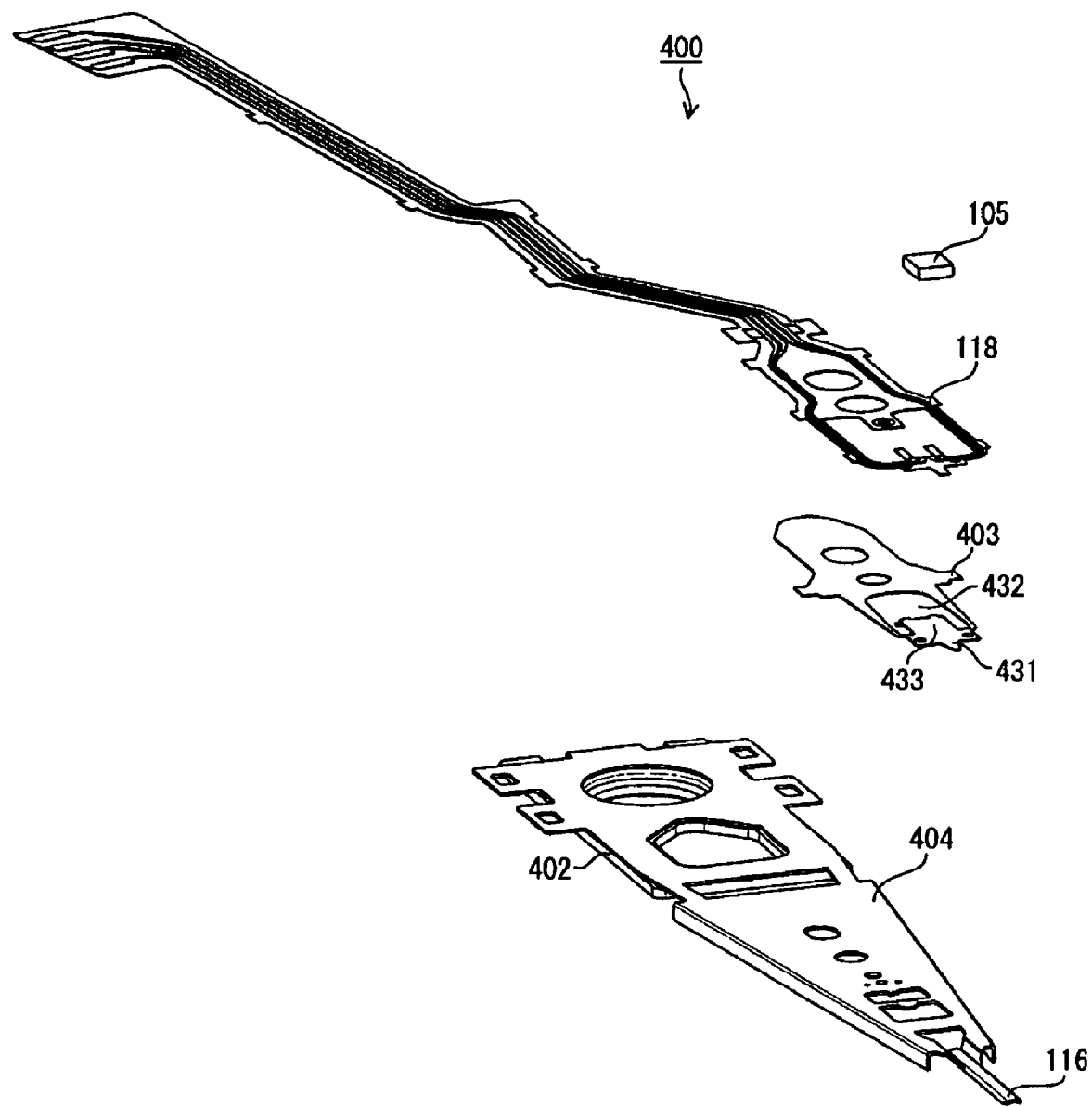
FIG. 4 is an exploded perspective view of the head suspension assembly.

FIG. 2 is a plan view showing a schematic construction of a head suspension assembly 400 used in this embodiment, FIG. 3 is a perspective view thereof, and FIG. 4 is an exploded perspective view showing components of the head suspension assembly 400. FIGS. 2(*a*), 3(*a*) and 4 show the construction of the head suspension assembly 400 as seem from the recording surface side of the magnetic disk 101, while FIGS. 2(*b*) and 3(*b*) show the construction of the head suspension assembly 400 as seen from the back side of the disk. In this embodiment, the head suspension assembly 400 is composed of plural components, including head 105, trace 118 and suspension 110.

The suspension 110 is composed of plural components, including a load beam 404, a gimbals 403 welded to a front portion of the load beam 404 by laser spot welding for example, and a mounting plate 402 welded to a rear portion of the load beam 404 on the side opposite to the head 105 holding side.

The load beam 404 is formed by a sheet such as a stainless metal sheet and functions as a precise sheet spring. The shape of the load beam 404 is designed so as to be reduced in both weight and thickness and retain a required rigidity. The tab 116 is formed at a front tip of the load beam 404 so as to project from the front tip. The tab 116 is integral with the load beam 404 and extends forward from the front tip of the load beam 404. By integral formation of the tab 116 with the load beam 404, it is possible to suppress an increase in weight of the load beam 404 (and the suspension 110) and thereby suppress the deterioration of dynamic characteristics.

The mounting plate 402 and the gimbals 403 may be formed of a stainless metal. The gimbals possesses a desired elasticity and is deformable. A gimbals tab 431 is formed at a front end of the gimbals 403. When the head suspension assembly 400 undergoes a shock from the exterior while the head 105 is unloaded onto the ramp 115, the gimbals tab 431 comes into contact with the ramp 115 and can thereby prevent damage of the head suspension assembly 400.

An aperture 432 is formed in the gimbals 403 at a position behind the gimbals tab 431. A gimbals tongue 433 projecting toward the center of the aperture 432 is formed nearly centrally of one front side (the gimbals tab 431 side) of the aperture. The head 105 is fixed through, for example, an epoxy resin of low elasticity to the gimbals tongue 433 projecting backward from one front side of the aperture 432.

The trace 118 described above for electrical connection between the head 105 and the FPC 117 comprises plural leads. The leads are integrally formed without mutual contact on an insulating sheet formed by a polyimide film. One ends of the leads constitute a multi-connector for connection to an internal circuit such as head amplifier. Opposite ends of the leads on the head 105 side are connected by soldering or gold bonding to pads formed on the slider of the head 105. The trace 118 is fixed to the gimbals 403 using an adhesive for example. Where required, the outside of the trace is covered with an epoxy resin or the like. The trace 118 can be formed integrally with the gimbals 403.

Figure 5:
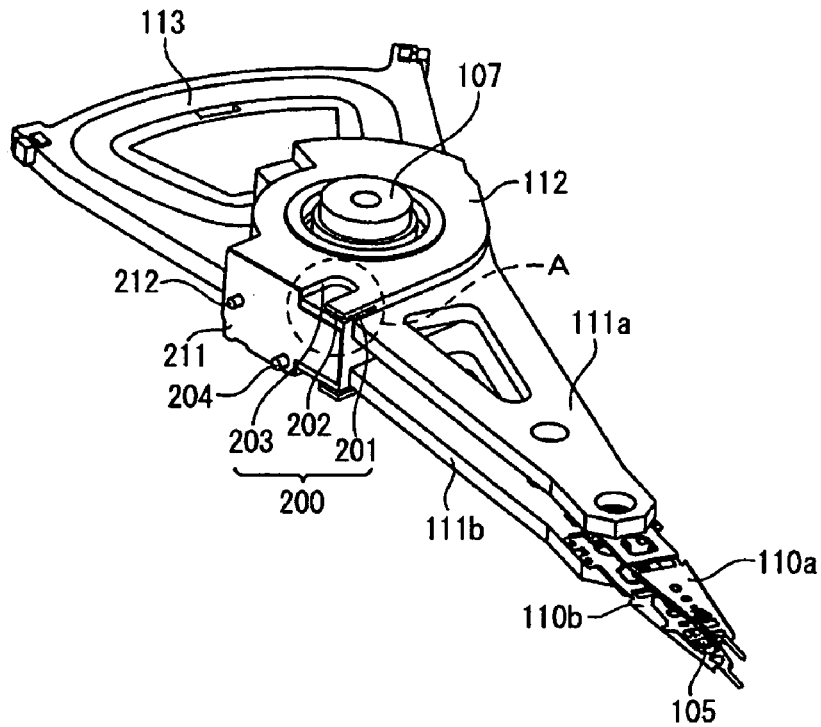
FIG. 5 is a perspective view showing a carriage portion used in the embodiment.
Figure 6:
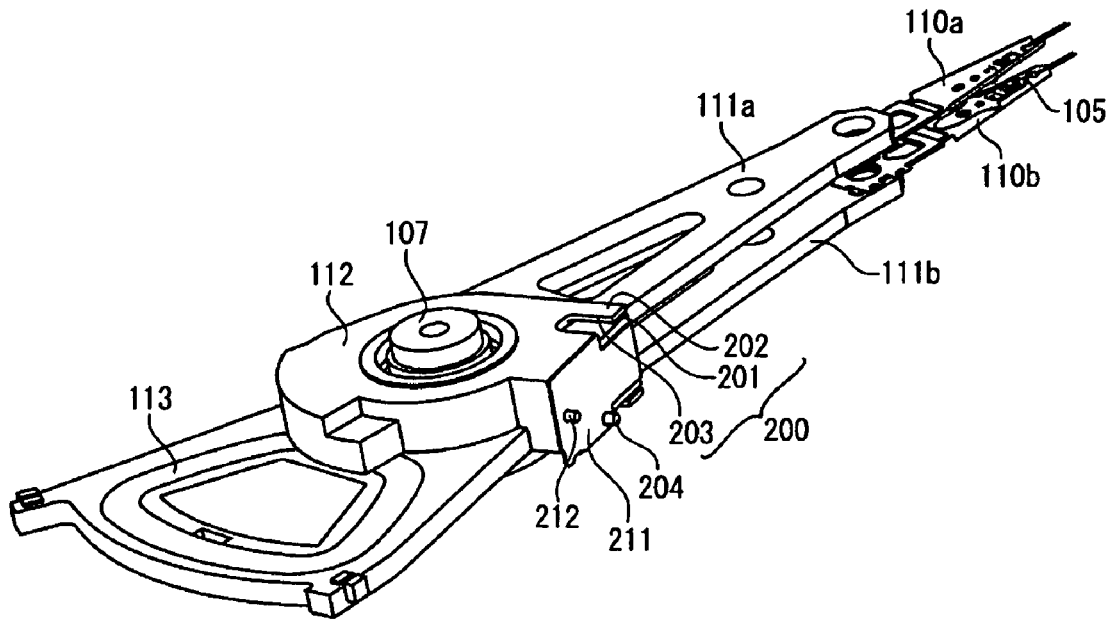
FIG. 6 is a perspective view of the carriage portion as seen at a different angle from FIG. 6.

Next, the arm coil support assembly used in this embodiment will be described in detail. FIGS. 5 and 6 are perspective views showing a carriage portion in this embodiment on a larger scale. The trace 118 described above is not shown in FIGS. 5 and 6. The arm coil support assembly comprises the arm 111 and the coil support 112. The coil support 112 used in this embodiment includes a force mechanism 200 indicated by a broken-line area A in FIG. 5. The force mechanism 200 not only prevents wafting of the trace 118 from the opposite surface of the arm 111 and assists it in extending on the opposite surface but also prevents wafting of the trace caused by warping of the bent portion which has been bent for connection to the FPC 117 fixed to a side face of the coil support 112.

Figure 7:
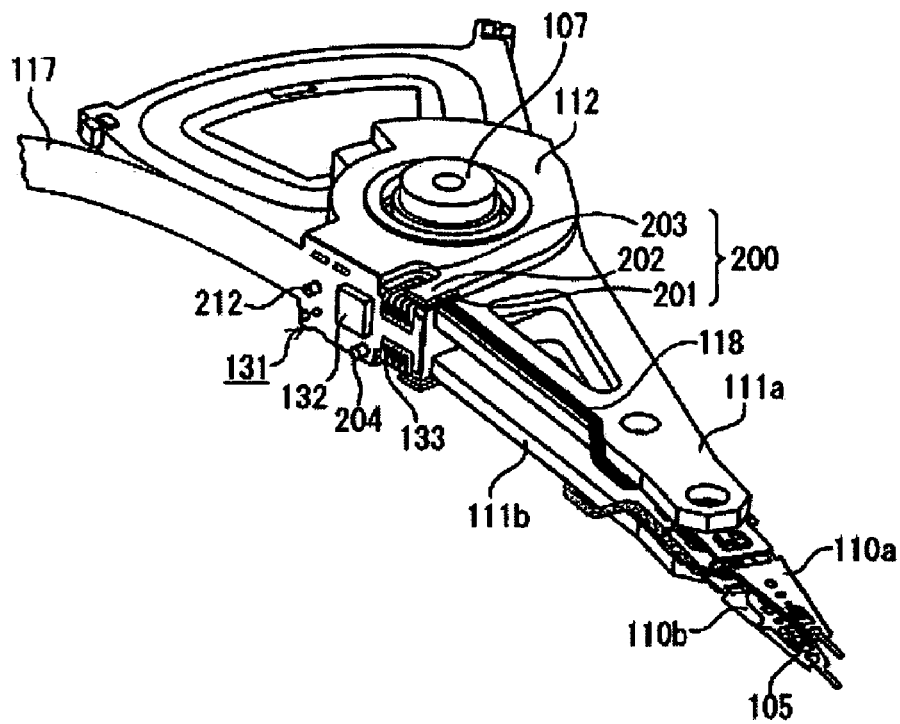
FIG. 7 is a perspective view showing a combination of an arm coil support assembly with FPC and trace in the embodiment.
Figure 8:
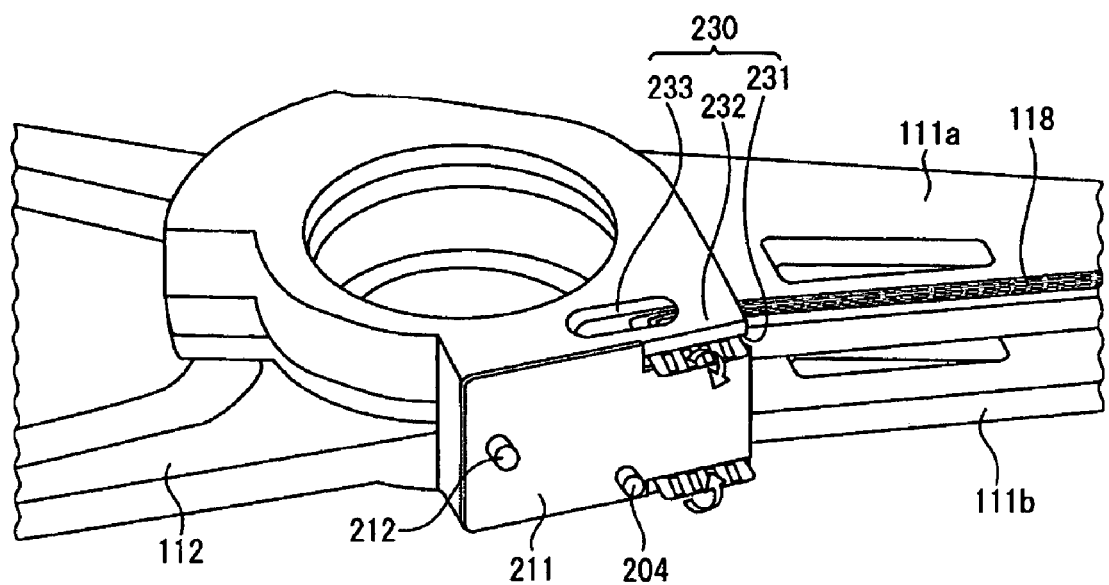
FIG. 8 is a perspective view showing on a larger scale a principal portion of a modification of a force mechanism A illustrated in FIGS. 5 and 6.
Figure 9:
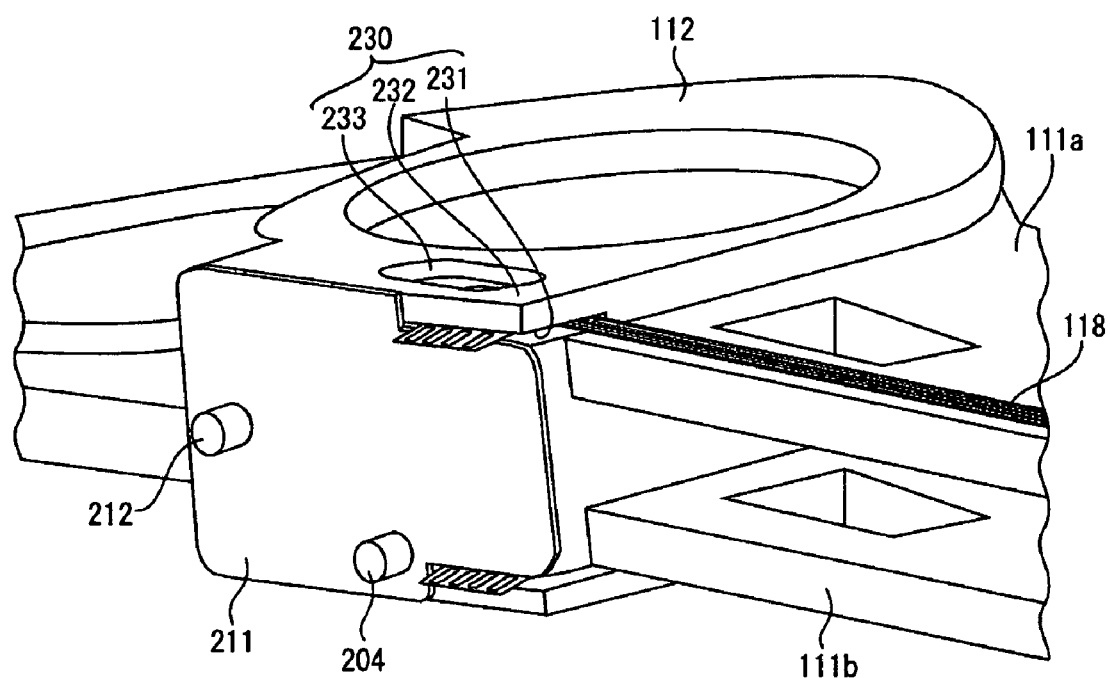
FIG. 9 is a perspective view showing the modification of the force mechanism A as seen at a different angle from FIG. 8.

FIG. 7 is a perspective view showing a combined state of the arm coil support assembly with FPC 117 and trace 118. FIGS. 8 and 9 are perspective views showing a force mechanism in the coil support on a larger scale, which is a modification of the force mechanism shown in FIGS. 5 to 7. The trace 118 is shown in FIGS. 8 and 9.

As shown in FIGS. 5 to 7, since the disk drive of this embodiment has a single disk of a double-side recording type, it includes suspensions 110*a* and 110*b* provided correspondingly to the two recording surfaces and also includes arms 111*a* and 111*b* for supporting the suspensions 110*a* and 110*b*, respectively. The suspensions 110*a*, 110*b* and the arms 111*a*, 111*b* will hereinafter be referred to simply as suspension 110 and arm 111 if no distinction is needed. The two arms 111 are fixed in a predetermined relation by the coil support 112. The coil support 112 used in this embodiment not only holds the VCM coil but also supports the arm 111. For example, the coil support 112 is formed by integral molding with use of a molding resin.

The trace 118 is laid near and along an edge portion on an opposite surface of the arm 111 opposite to a confronting surface of the arm which confronts the recording surface of the disk 101. One end of the trace 118 is connected to the head 105, so if it is extended as it is, the trace is laid on the confronting surface of the arm 111. On the other hand, if the trace 118 is disposed not on the confronting surface but on the opposite surface isolated from the recording surface of the disk 101, it is possible to suppress flutter of the disk caused by wind disturbance which is induced by rotation of the disk. Therefore, the trace 118 is bent beforehand so as to extend from the confronting surface on which the head 105 is mounted and along a side face located in a direction orthogonal to the recording surface of the disk 101 and then reach the opposite surface isolated from the disk recording surface. Thus, in the vicinity of the bonded portion of the arm 111 to the suspension 110, the trace 118 extends from the confronting surface and along a side face of the arm 111 and is laid on the opposite surface. The other end of the trace 118 is bent nearly vertically and is connected to the terminal portion of FPC 117, as will be described later.

The coil support 112 includes a pressure portion 202 spaced through a gap 201 from the surface on which the trace 118 is disposed. The pressure portion 202 is provided at a position corresponding to the end portion of the arm 111 opposite to the end portion thereof to which the suspension 110 is fixed, i.e., the position where the arm 111 is fixed. The force mechanism 200 for the trace 118 is constituted by the gap 201, the pressure portion 202 and an aperture 203 which will be described later. By inserting the trace 118 into the gap 201 of the force mechanism 200, the trace 118 can be maintained in a laid state on the opposite surface of the arm 111 without being fixed using an adhesive or the like.

A backing plate 211 formed of a metal such as stainless steel is secured to a side face portion of the coil support 112, and the FPC 117 is fixed onto the backing plate 211. A pre-amplifier for amplifying signals in the head 105 is mounted on the FPC 117. Although the coil support 112 used in this embodiment is formed of a molding resin, the heat produced in the FPC 117 can be dissipated through the backing plate 211. It is not necessary to use the backing plate 211 in the case where the use thereof is not specially required, for example, when the pre-amplifier is not mounted on the FPC 117 or when the coil support 112 is formed of a metal.

As shown in FIG. 7, an end portion of the FPC 117 is formed as a terminal portion 131 for connection to the trace 118. In the terminal portion 131 are provided terminals 133 for connection to the pre-amplifier indicated at 132 and the trace 118. The terminal portion 131 is fixed onto the backing plate 211 which is provided on a side face of the coil support 112. In this case, the backing plate 211 is fixed using two positioning pins 212 and 204 formed on the coil support 112.

As described earlier, the trace 118 is disposed near and along an edge portion on the opposite surface of the arm 111 and is inserted into the gap 201 of the force mechanism 200. FIGS. 8 and 9 show an inserted state of the trace 118 into the gap 201 of the force mechanism 200. The trace 118 is bent nearly vertically and is connected for example by laser spot welding to the terminal portion 131 of the FPC 117 which is fixed to the backing plate 211 on the side face portion of the coil support 112. At this time, the pressure portion 202 of the force mechanism 200 positions and fixes the trace 118 onto the arm 111 and prevents warping of the trace caused by a repulsive force resulting from the vertical bending. Therefore, the width of the gap 201 may be set at an appropriate width taking the easiness of insertion of the trace 118 into the gap and the warp preventing function into account, provided the gap width should be a width enabling insertion or loose insertion of the trace into the gap or a larger width.

In the pressure portion (plate portion) of the force mechanism 200, an aperture 203 reaching the gap 201 may be formed in a position where an end portion of the trace 118 can be exposed, whereby at the time of inserting the trace 118 loosely into the gap 201 or at the time of connecting the trace 118 and the FPC 117 with each other, the trace 118 can be held down directly from the aperture 203 and hence it is possible to improve the workability.

The aperture 203 may be formed concavely from the edge of the pressure portion as shown in FIGS. 5 to 7. Alternatively, an aperture 233 may be formed as shown in FIGS. 8 and 9. Other constructional points are the same as in the force mechanism 200. More specifically, a force mechanism 230 according to a modification of the force mechanism 200 comprises a pressure portion 232 spaced through a gap 231 for insertion therein of the trace 118 from the trace-disposed surface, the trace 118 extending from the confronting surface of the arm 111 and along a side face of the arm onto the opposite surface, and the aperture 233 to which the trace 118 is exposed and which is disposed on the pressure portion 232. Also in this case, the trace 118 can be exposed from the aperture 233 and it is possible to contact the trace 118 directly from the aperture 233, whereby the workability can be improved as is the case with the force mechanism 200. Of course, it is not always necessary to provide such an aperture.

In this embodiment, the force mechanism 200 (230) having the pressure portion 202 spaced through the gap 201 from the trace 118-disposed surface is provided for insertion therein of the trace 118 which is disposed near the connection between the coil support 112 and the arm 111 and along an edge portion on the opposite surface of the arm 111. Thus, the trace 118 can be laid along an edge portion on the opposite surface of the arm 111 and it is possible to avoid contact of the trace 118 with the recording surface of the disk 101 without forming a guide for the trace 118 such as a stepped portion or a groove. In this embodiment, therefore, the cost for machining the arm which is required in the conventional HDD can be saved.

However, in the case where the trace 118 is disposed on the opposite surface, there arises the necessity of bending the trace to the confronting surface side at the time of connection to the FPC 117. If the trace is so bent, a repulsive force induced by the bending at the bent portion causes the trace 118 to waft from the opposite surface of the arm 118. In this embodiment, the trace 118 is inserted into the gap 201 or 231 formed in the force mechanism 200 or 230 and is bent, whereby the trace 118 tending to waft under the repulsive force can be held down. Thus, it is possible to prevent wafting of the trace caused by the bending.

Since the trace 118 is disposed not on the confronting surface of the arm 111 that confronts the recording surface but on the opposite surface of the arm isolated from the recording surface, there is no fear of influence of wind disturbance or the like during read or write of information even without fixing the trace 118. Moreover, with the force mechanism 200 or 230 alone, not only the function of preventing wafting of the trace 118 from the opposite surface and maintaining it in its laid state on the opposite surface can be attained, but also it is possible to prevent warping of the trace 118 caused by bending of the trace for connection to the FPC 117. Thus, with the force mechanism 200 or 230 alone, even without fixing the trace 118 to the arm 111 for example, the function of preventing contact between the trace 118 and the disk 101 can be attained and it becomes possible to provide the HDD 100 at low cost.

Further, the coil support 112 used in this embodiment is formed by integral molding with use of a molding resin. According to the integral molding using a molding resin, even in the case of a complicated shape, the manufacture thereof is easy once a mold thereof is produced, and even the provision of the force mechanism described above scarcely exerts any influence on the cost. Thus, a carriage part high in productivity can be provided at an extremely low cost. Consequently, it is possible to further improve the cost performance of the hard disk drive.

A hard disk drive according to a second embodiment of the present invention will now be described. The HDD of the previous first embodiment has a single disk, while the HDD of this second embodiment has plural disks. The second embodiment is different in this point from the first embodiment. In case of using plural magnetic disks, the disks are integrally held at predetermined intervals in the rotating shaft direction of the spindle motor. Suspensions each holding a head for scanning a recording surface are provided in a number corresponding to the number of recording surfaces and are fixed to the coil support 112 through arms in positions where they overlap the suspension 110 shown in FIG. 1 at predetermined intervals.

In the case where the HDD uses two or more disks and has a recording surface on top or bottom surface or on both top and bottom surfaces (these surfaces will hereinafter be referred to as "outermost surfaces"), arms provided correspondingly to the outermost surfaces each have an opposite surface opposite to a confronting surface which confronts a recording surface. Therefore, as is the case with the first embodiment, a trace can be disposed on the opposite surface of each arm. By providing a force mechanism at a position opposed to the trace, it is possible to prevent wafting of the trace from the opposite surface in each of the arms provided correspondingly to the outermost surfaces. That is, if a disk is not present on one side of each of the arms, then by providing a force mechanism, it is possible to dispose a trace in an extremely simple manner and at low cost.

It goes without saying that the present invention is not limited to the above embodiments, but that various changes can be made within the scope not departing from the gist of the present invention. For example, although in the above embodiments the trace is bent and connected to the FPC, the FPC may be bent and connected to the trace. In this case, the pressure portion functions to prevent wafting of the trace from the opposite surface and also prevent wafting of the FPC from the arm surface caused by bending of the FPC. In the case where the FPC is bent and connected to the trace on the trace-disposed surface, the connection may be done in the exposed trace-FPC connection through the foregoing aperture formed in the force mechanism. The present invention is also applicable to an HDD having a magnetic disk of a single-side recording type.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A disk drive comprising:
   a head for performing either write or read of information to or from one or more disks;
   an arm configured to support said head;
   a flexible printed circuit board;
   a trace disposed on a top surface of said arm, the top surface is opposite to a confronting surface which confronts a recording surface of said one or more disks, one end of said trace being connected to said head, and an opposite end of said trace having a bend and connected to said flexible printed circuit board,
   wherein the bend of the trace is located at a pivot junction of the arm; and
   a force mechanism formed from a coil support to support a VCM coil and said arm, the force mechanism configured to prevent wafting of said trace from said top surface caused by said bend of the trace, said force mechanism having a pressure portion being spaced by a gap from the top surface,
   wherein the bend of said trace is inserted into said gap and maintained in a laid state by the pressure portion without being fixed using an adhesive.

2. The disk drive according to claim 1, wherein the bend of said trace is nearly perpendicular to said confronting surface side and is connected to said flexible printed circuit board.

3. The disk drive according to claim 1, wherein said coil support is formed by integral molding.

4. The disk drive according to claim 3, wherein said coil support is provided on a side face thereof with a metallic plate for fixing thereto of said flexible printed circuit board, and said trace and said flexible printed circuit board are connected together on said metallic plate.

5. The disk drive according to claim 1, wherein said coil support and said pressure portion are formed by integral molding with use of a molding resin.

6. The disk drive according to claim 1, wherein the head is configured to perform writing or reading of information to or from only one disk.

7. The disk drive according to claim 1, wherein the number of said one or more disks is one and recording surfaces are formed on both sides respectively of the disk, and said head and said arm are provided for each of said recording surfaces.

8. The disk drive according to claim 1, wherein the number of said one or more disks is two or more and a recording surface is formed on at least an outermost surface of said disks, and said force mechanism prevents wafting of said trace disposed on said top surface of said arm which is provided for the recording surface of said outermost surface.

9. The disk drive according to claim 1, wherein, the bend of the trace is at or nearly at a 90° angle in a single direction.

10. The disk drive according to claim 1, wherein the trace traverses a length between a pivot shaft of the arm and a suspension on the top surface of the arm.

11. An arm coil support assembly comprising:
    an arm configured to support a head for performing either write or read of information to or from one or more disks; and
    a coil support to support said arm, said coil support having a gap for insertion therein of a trace, said trace being disposed on a top surface of said arm, the top surface is opposite to a confronting surface which confronts a recording surface of said one or more disks,
    wherein a bend of said trace is inserted into said gap and maintained in a laid state without being fixed using an adhesive,
    wherein the bend of the trace is located at a pivot junction of the arm.

12. The arm coil support assembly according to claim 11, wherein said coil support has a plate portion having said gap from the surface on which said trace is disposed; and wherein said plate portion prevents wafting of said top surface of said arm by the bend of said trace, which one end is connected to said head and the bend of the trace is connected to flexible printed circuit board, is disposed on said top surface.

13. The arm coil support assembly according to claim 11, wherein said coil support is formed by integral molding.

14. The arm coil support assembly according to claim 11, wherein said coil support is formed by integral molding with use of a molding resin.

15. A disk drive comprising:
    a head for performing either write or read of information to or from one or more disks;
    an arm supporting the head;
    a flexible printed circuit board;
    a trace disposed on a top surface of the arm, the top surface is opposite to a confronting surface which confronts a recording surface of the one or more disks, one end of the trace being connected to the head, and an opposite end of the trace having a bend and connected to the flexible printed circuit board,
    wherein the bend of the trace is located at a pivot junction of the arm; and
    a coil support to support a VCM coil and the arm, the coil support including a force mechanism having a pressure portion being spaced by a gap form the top surface on which the trace is disposed,
    wherein the bend of the trace is inserted into the gap, connected to the flexible printing circuit board, and maintained in a laid state by the pressure portion without being fixed using an adhesive.

16. The disk drive according to claim 15, wherein the pressure portion of the force mechanism includes an aperture to expose the trace.

17. The disk drive according to claim 15, wherein the coil support and the pressure portion are formed by integral molding.

18. The disk drive according to claim 15, further comprising a metallic backing plate disposed on a side face of the coil support, the flexible printed circuit board being attached to the backing plate, and trace and the flexible printed circuit board being connected together on the backing plate.

19. The disk drive according to claim 15, wherein the bend of the trace is nearly perpendicularly relative to the confronting surface side of the arm and is connected to the flexible printed circuit board.

* * * * *